United States Patent [19]

Higham et al.

[11] 4,052,661
[45] Oct. 4, 1977

[54] NUCLEAR MAGNETIC RESONANCE PROBE

[75] Inventors: Peter Higham, High Wycombe; Robert Alan Hoult, Beaconsfield, both of England

[73] Assignee: The Perkin-Elmer Corporation, Norwalk, Conn.

[21] Appl. No.: 685,739

[22] Filed: May 13, 1976

[30] Foreign Application Priority Data

May 14, 1975 United Kingdom ............... 20384/75

[51] Int. Cl.² ........................................... G01R 33/08
[52] U.S. Cl. ................................................ 324/.5 R
[58] Field of Search ................. 324/.5 R, .5 A, .5 AH

[56] References Cited

U.S. PATENT DOCUMENTS

| 3,531,715 | 9/1970 | Watson | 324/.5 R |
|---|---|---|---|
| 3,603,871 | 9/1971 | Caunter | 324/.5 R |

Primary Examiner—M. Tokar
Attorney, Agent, or Firm—S. A. Giarratana; F. L. Masselle; J. D. Crane

[57] ABSTRACT

Spurious voltage in the receiver coil of a nuclear magnetic resonance probe due to stray induction is cancelled out by inducing a voltage of correct phase and amplitude in a balance winding which is in RF coupling relationship to the receiver coil.

12 Claims, 8 Drawing Figures

NUCLEAR MAGNETIC RESONANCE PROBE

BACKGROUND OF THE INVENTION

1. Field of the Invention

This invention relates to Nuclear Magnetic Resonance (N.M.R.) probe systems of the so called crossed-coil type wherein a transmitter coil and a receiver coil are arranged with their magnetic axes substantially orthogonal to each other so as to minimize electromagnetic coupling therebetween. The invention is particularly related to the substantial cancellation of any spurious RF voltage set up in the receiver coil by undesired electromagnetic and electrostatic couplings between the receiver section of the probe (receiver coil and appertaining RF circuit) and the transmitter section (transmitter coil and appertaining RF circuit).

It must be understood that for the purposes of the present specification the phrase "probe system" refers either to the probe along, i.e., a plurality of functionally interrelated electrical and mechanical parts within a housing adapted to be positioned in predetermined attitude within the polarizing magnetic field of an NMR spectrometer, or to the probe and any ancillary devices required for its control, wherever said devices may be mounted, e.g., on the probe externally thereof or at some remote location such as on the spectrometer control panel or an accessory panel.

2. Description of the Prior Art

An ideal crossed-coil probe system would ensure that in operation, no RF voltage appeared in the receiver coil other than in correspondence of those regions of the scanned NMR spectrum where resonances actually occurred in the sample under analysis. In other words, the receiver coil would respond to nuclear induction only. As a first step towards approximating this desirable performance, it is usual to take great care over the electromagnetic orthogonality of the transmitter and receiver coils, but even if perfection could ever be achieved, stray electromagnetic couplings between transmitter and receiver sections would cause a standing RF voltage to be induced in the receiver coil.

It is clear than any electrostatic coupling must produce a similar result and in some probe designs, the receiver coil is in fact surrounded by a Faraday screen. Again, electrostatic screening cannot be perfect.

We must conclude that in a probe system of the type referred to, stray electromagnetic and electrostatic couplings are unavoidable and it follows that the presence of spurious RF voltage in the receiver coil must be expected. Cancellation by some suitable means is the practical approach to the problem. The cancelling operation is known in the art as "probe balancing".

Various probe balancing schemes have been suggested in the past and one that has been in use for a long time relies on trimming devices in the form of guides and paddles which distort the electromagnetic flux from the transmitter coil and deliberately introduce an induction vector of the right amplitude and phase to set up an RF voltage in the receiver coil which substantially cancels the spruious RF voltage therein.

A much improved scheme is disclosed in U.S. Pat. No. 3,603,871, wherein the transmitter coil is arranged in two halves and the electromagnetic orthogonality of each with respect to the receiver coil is deliberately imparied by orienting them (or shaping them) in such manner as to give rise at the receiver coil to electromagnetic induction vectors of opposite signs and similar amplitudes. By repeated phase and amplitude adjustments of the RF voltage across each half in turn, a resultant vector is produced which is the sum of the standing vector initially existing (as a result of stray couplings) and the vector produced by one of the transmitter coil halves. The resultant vector is cancelled by an equal and opposite induction vector produced by the other coil half. This scheme has been found quite satisfactory in practice and one of its virtues is the total elimination of the Faraday screen since it can be made to have enough cancelling range to cope with any standing RF voltage no matter whether its origin is electromagnetic or electrostatic.

We have now recognized that probe balance methods which resort to steering of the electromagnetic flux from the transmitter coil cause undesirable magnetic and electromagnetic disturbances in the critical magnetic volume of high intrinsic homogeneity in which the NMR sample is located while supported in the probe.

Whether flux steering is implemented by interposing flux guides between the transmitter coil and the receiver coil or by interfering with the orthogonality of the transmitter coil with respect to the receiver coil, the irradiation pattern of the transmitter coil is clearly distorted as a result. This has an adverse effect on the sharpness of the NMR response in spin-decoupling experiments. In addition, the magnetic homoengeity of the magnetic volume "seen" by the NMR sample tends to be degraded. The reason for this concomitant effect is not immediately apparent and is worth explaining.

Practical materials used in the construction of probe elements that in operation will be located within the field of the polarizing magnet near the working gap thereof (among them the copper wire of the transmitter coil) have a magnetic susceptibility that is almost inevitably other than zero. They will therefore tend to increase the density of the lines of force passing therethrough compared with what their density would be in free air (which is of zero susceptibility) if they are paramagnetic (susceptibility greater than zero) and to decrease it if they are diamagnetic (susceptibility smaller than zero). In either case, their presence will obviously have some de-homogenizing effect on the magnetic field in the working gap, since it interferes with the honogeneous distribution of the magnetic lines of force thereat. In order that this effect be minimized, the materials are arranged to give reasonable uniformity of susceptibility around the working-gap centre. The introduction of flux guides, which by their very nature, are devices of irregular susceptibility, is bound to disturb said uniformity quite significantly. Interfering with the shape and orientation of the transmitter coil to provide a small controllable electromagnetic coupling between the transmitter coil and the receiver coil has a similar but much less significant effect.

Another problem associated with flux steering as referred to is that it tends to restrict the cancellation range since a wider range can only be achieved at the cost of increased megnatic and electromagnetic distortion.

An attempt to avoid flux steering methods in achieving NMR probe balance has been made by resorting to means remote from the carefully controlled operational environment of the probe within the NMR magnet for generating an RF voltage matching in frequency, phase and amplitude the spurious RF voltage in the receiver coil. The solution involves unnecessary complexity of apparatus and is operationally inconvenient in that the cancelling action is subject to drift mainly because it is generated outside the probe environment.

The problem left essentially unresolved by the prior art is how to provide a crossed-coil NMR probe system including probe balancing means which:

a. avoid flux steering and thus have no significant effect on the magnetic homogeneity of the polarizing field of the NMR spectrometer and the uniformity of the sample irradiating pattern produced by the transmitter coil;

b. provide an ample cancelling range to take care without compromise of the contributions to the spurious RF voltage due to electrostatic induction effects, without requiring the use of a Faraday screen;

c. are within the immediate environment of the volume occupied in operation by the NMR sample, so as to enable inherently drift-free balancing operation;

d. allow considerable latitude in design.

SUMMARY OF THE INVENTION

For the solution of the problem outlined above which has not been met by the prior art, the present invention contemplates an NMR probe system of the type referred to comprising substantially electromagnetically orthogonal transmitter and receiver coils. A balancing coil within the probe is inductively coupled to the transmitter coil and is arranged in RF signal transfer relationship with the receiver coil. Electrical trimmers are provided for adjusting the phase and amplitude of an RF voltage set up in operation across the transmitter coil by a source of RF potential so that a cancelling voltage equal in amplitude and opposite in phase to any spurious RF voltage in the receiver coil may be induced in the balancing coil.

DETAILED DESCRIPTION OF THE PREFERRED EMBODIMENT

Figure 1:
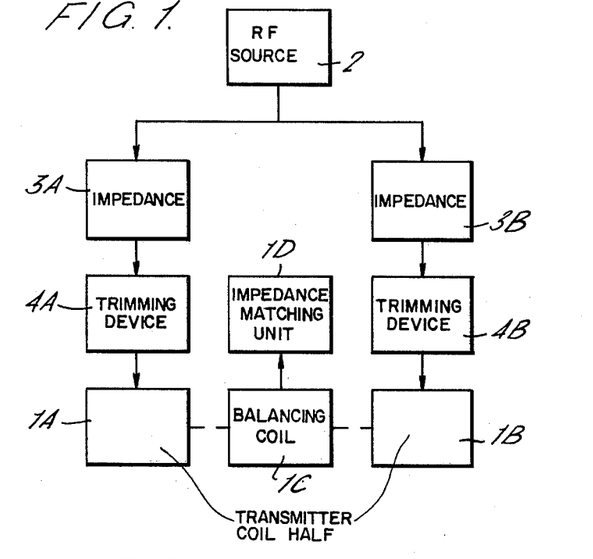
FIG. 1 is a block diagram of an NMR probe system in accordance with the present invention.

In FIG. 1, two halves 1A and 1B of a transmitter coil forming part of a probe system in accordance with the present invention are fed in parallel from a common source 2 of RF potential (which would not normally form part of the probe itself) via impedances 3A and 3B that are high compared with the impedance of the source 2 and via phase and amplitude trimming devices 4A and 4B.

Electromagnetically coupled to coil halves 1A and 1B is a balancing coil 1C feeding into impedance matching unit 1D, the function of which will be made clear later in the description with reference to FIG. 3.

Figure 2:
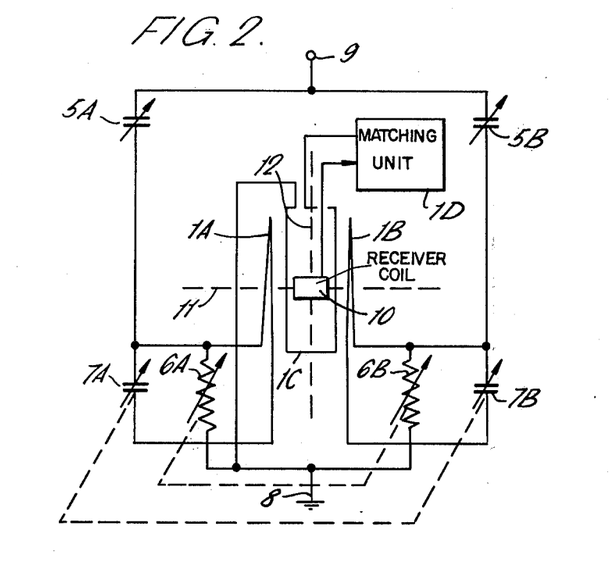
FIG. 2 is a combined schematic and block diagram elaborating upon the block diagram of FIG. 1.

In the generalized practical layout of FIG. 2, the high impedances are variable capacitors 5A and 5B and the trimming devices are each a combination of a variable resistor (resistors 6A and 6B) and a variable capacitor (capacitors 7A and 7B), one combination being shunted across coil half 1A and the other across 1B. The coil halves have a common earth point 8 and a common live point 9, to which points the RF supply (not shown) would be connected in operation.

The coils halves 1A and 1B (each of generally rectangular configuration, for example) are arranged with their magnetic axis (dotted line 11) orthogonal to the magnetic axis (dotted line 12) of the receiver coil 10. The balancing coil 1C lies between coil halves 1A and 1B, with its magnetic axis normal to the plane of the paper and, consequently, to the magnetic axis of the coil 10 and that of the transmitter coil halves. As we shall see later, the balancing coil 10 may itself be formed in two halves for better all-round symmetry with respect to the other coils. If coil 1C is assumed to be one of the two halves, the other half should be imagined at the back of it on a substantially coincident magnetic axis.

The receiver coil 10 terminates at the matching unit 1D. Note that the line with the arrow head is meant to denote a signal route rather than a wire connection. The unit 1D and its relationship with the receiver coil 10 and the balancing coil 1C is better understood with reference to FIG. 3, which we shall later describe.

Because of the parallel energization of the two transmitter coil halves, it should in theory be possible to cancel out the electromagnetically induced voltage appearing across the receiver coil 10 as a result of the stray coupling between it and one half of the transmitter coil with the voltage due to the stray coupling between it and the other coil half, provided the couplings acted antagonistically so that the induced voltages were in opposition. In practice, even when (a) the transmitter coil is carefully constructed and assembled relative to the receiver coil, (b) the voltages due to the residual couplings oppose and (c) the RF voltage across the halves is adjusted for minimum standing RF voltage in the receiver coil, this standing voltage cannot be reduced to zero because certain uncompensated electromagnetic couplings remain sufficient to cause RF leakage into the receiver coil. This electromagnetically produced leakage forms the major component of the total spurious RF voltage across the receiver coil.

There will also be present in the induced voltage a significant component due to electrostatic induction, since in the embodiment under review no Faraday screen is interposed between transmitter and receiver coils. The receiver coil cannot distinguish between the elecromagnetic and electrostatic contributions made by the two halves of the transmitter coil to the induced signal andd merely "sees" the end voltage resulting from the vectorial sum of the contributions. By proper adjustment of the trimming devices said end voltage, in which there is represented both the electromagnetic and the electrostatic induction effect may be reduced to a neglibible level.

In FIG. 2, it is assumed that the two transmitter coil halves 1A and 1B are within a polarizing magnetic flux extending at right angles to the plane of the paper between the two pole pieces of a polarizing magnet (not shown) defining a working gap and that the sample carrier is introduced in coil 10 along axis 12. In the case of a cryogenic magnet, essentially a superconducting solenoid, the sample must be introduced axially of the solenoid and the receiver coil as well as the transmitter coil will have to be divided in two.

In setting up the probe broadly outlined in FIG. 2, variable capacitors 5A and 5B are first adjusted so as to establish approximately equal voltages across the two halves 1A and 1B of the transmitter coil, as measured by a suitable instrument, while the trimming devices 7A, 7B and 6A, 6B are set at the middle of their range. Since the two longitudinal sides of the balancing coil 1C will have induced in them voltages of substantially equal amplitude but opposite sign, the voltage injected into the receiver coil 10 through the matching unit 1D should be negligible after this preliminary adjustment has been carried out. A standing RF voltage will generally still be present in the receiver coil 10 which is due in the main to certain unavoidable asymmetries, such as the asymmetry created by having to keep the lead out wires of the coil 10 at a reasonable distance from each other to avoid a lossy capacitor effect, which their close proximity would in practice entail. The lead out wire thus represents a loop, additional to the turns of the receiver coil, which is capable of picking up stray RF because of the lack of electromagnetic symmetry between it and the two halves, respectively, of the transmitter coil.

Now it is the turn of the trimming devices. By alternate adjustment of the variable resistors 6A and 6B, on the one hand, and the variable capacitors 7A and 7B, on the other, while monitoring the receiver coil voltage with a suitable instrument, we rapdidly converge towards setting up a voltage in the balancing coil 1C which is substantially equal in amplitude and opposite in phase compared with the standing voltage originally existing in the receiver coil 10. When this has been achieved, the crossed coil system is said to be in balance, which means that the effect of all stray couplings, electromagnetic and electrostatic alike, has been minimized.

Since the voltage induced in coil 1C by coil half 1A is in opposition to that induced in it by coil 1B, the amplitude and phase adjustments of the two halves must take place in opposite directions, and, by suitably matching the sensitivities of the controls, resistors 6A and 6B may be ganged for differential action, and similarly for capacitors 7A and 7B. In this manner, the balancing operation can be very expediently performed by operating one control with the left hand and one with the right while observing a suitable instrument monitoring the voltage across the receiver coil 10.

While the ganged resistors 6A and 6B and the ganged capacitors 7A and 7B may be provided in either the probe itself or at a remote location, in this latter case, it may be found undesirable in certain circumstances to set up comparatively long RF paths between the probe and its controls. A solution which we have found very satisfactory is to employ voltage sensitive resistors and capacitors and to effect remote control by adjusting the DC polarization through DC lines extending any desired distance from the probe.

Figure 3:
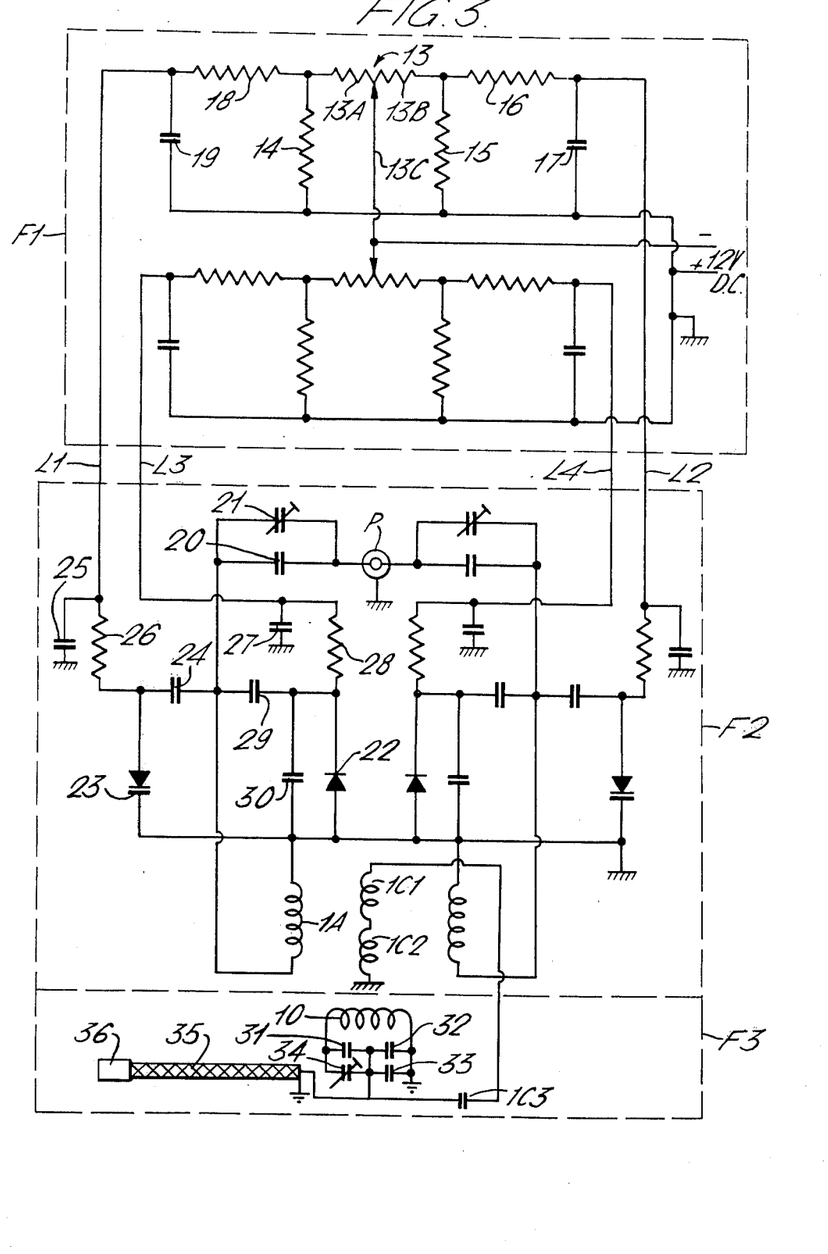
FIG. 3 is a circuit diagram of an NMR probe system in accordance with the present invention.

Remote probe balance control has been incorporated in the circuit diagram of a production probe illustrated in FIG. 3, wherein the object of the circuitry enclosed on Frame F1 is to provide differentially varying DC levels on lines L1 and L2 for controlling the voltage sensitive capacitors and similar levels on line L3 and L4 for controlling the voltage sensitive resistors.

Frame 1 encloses two similar networks fed in parallel from a common DC supply of 12 volts. The upper network comprises a potentiometer 13, the two sections of which, 13A and 13B, on one and other side, respectively, of the slider 13C, constitute the upper adjacent arms of a Wheatstone bridge, of which resistors 14 and 15 represent the lower adjacent arms. If the bridge is in balance, lines L1 and L2 will be at the same potential above ground, and if the slider 13C is moved from the position of balance in one and other direction, the voltages above ground on L1 and L2 will vary differentially.

Resistor 16 with capacitor 17 form a filter to bypass stray AC voltages to ground, and a similar purpose is served by resistor 18 and capacitor 19 on the other side.

The circuitry within frame F2 likewise comprises two identical parts, left and right respectively of the coaxial plug P for the RF irradiating power, and we shall confine the description to the left side, wherein capacitors 20 and 21 together are the equivalent of 5A in FIG. 2, voltage sensitive resistor 22 (P.I.N. diode) is equivalent to variable resistor 6A and voltage sensitive capacitor 23 (Varicap) to capacitor 7A.

Furthermore, capacitor 24 isolates the DC supply from the RF feed to transmitter coil half 1A, capacitor 25 and resistor 26 prevent RF from entering into the DC supply through line L1, and similarly for capacitor 27 and resistor 28 in respect of line L3. A DC blocking capacitor 29 is also included to prevent the DC feed to P.I.N. diode 22 from being admitted to the coil 1A.

Capacitor 29 forms in addition a potential divider in conjunction with capacitor 30, the capacitance values being so chosen that at the irradiating RF frequency of 60 Mc/s the P.I.N. diode 22 "sees" across it a middle-range resistor of 90 ohms, and the coil 1A a corresponding resistance of 3800 ohms. This impedance transformation is intended for enabling the P.I.N. diode to be operated at the centre of its impedance range where the sensitivity of the device, i.e., change of resistance versus DC control current, is linear.

In describing FIG. 2, we suggested that coil 1C might be divided into two halves. In FIG. 3, we have in fact two balancing coil halves, 1C1 and 1C2, each functioning in the manner of coil 1C in FIG. 2. This means that two equal and opposite voltages will be set up in each balancing coil half after the RF supply voltages across the two transmitter coil halves have been equalized as described. Upon operating the trimming devices, one of the two voltages in each balancing coil half will become dominant.

The connection between the balancing coil halves must naturally be such that the two dominant RF voltages add up, in order to provide a resultant voltage for balancing out the standing RF voltage in the receiver coil 10. This is achieved by what would normally be regarded as a series-opposing connection but is in fact "seen" by the dominant RF voltages as series-aiding. The reason for this may be appreciated with the aid of FIG. 3A.

Figure 3A:
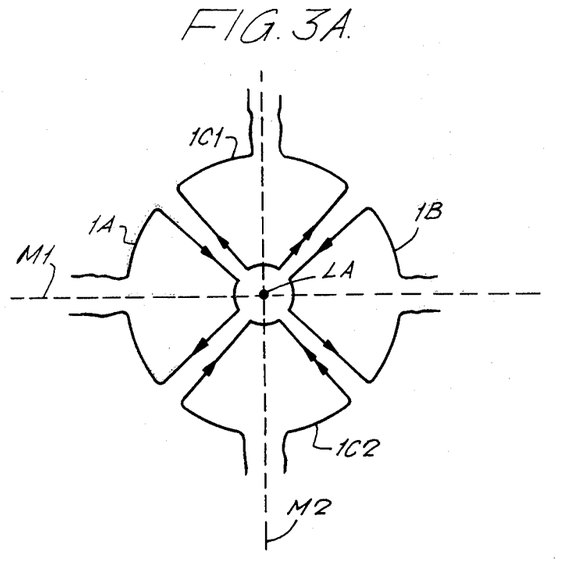
FIG. 3A is a diagram showing the phase of the RF voltages induced in each half of a divided balancing coil as shown in FIG. 3.
Figures 4, 4A, 4B, 4C:
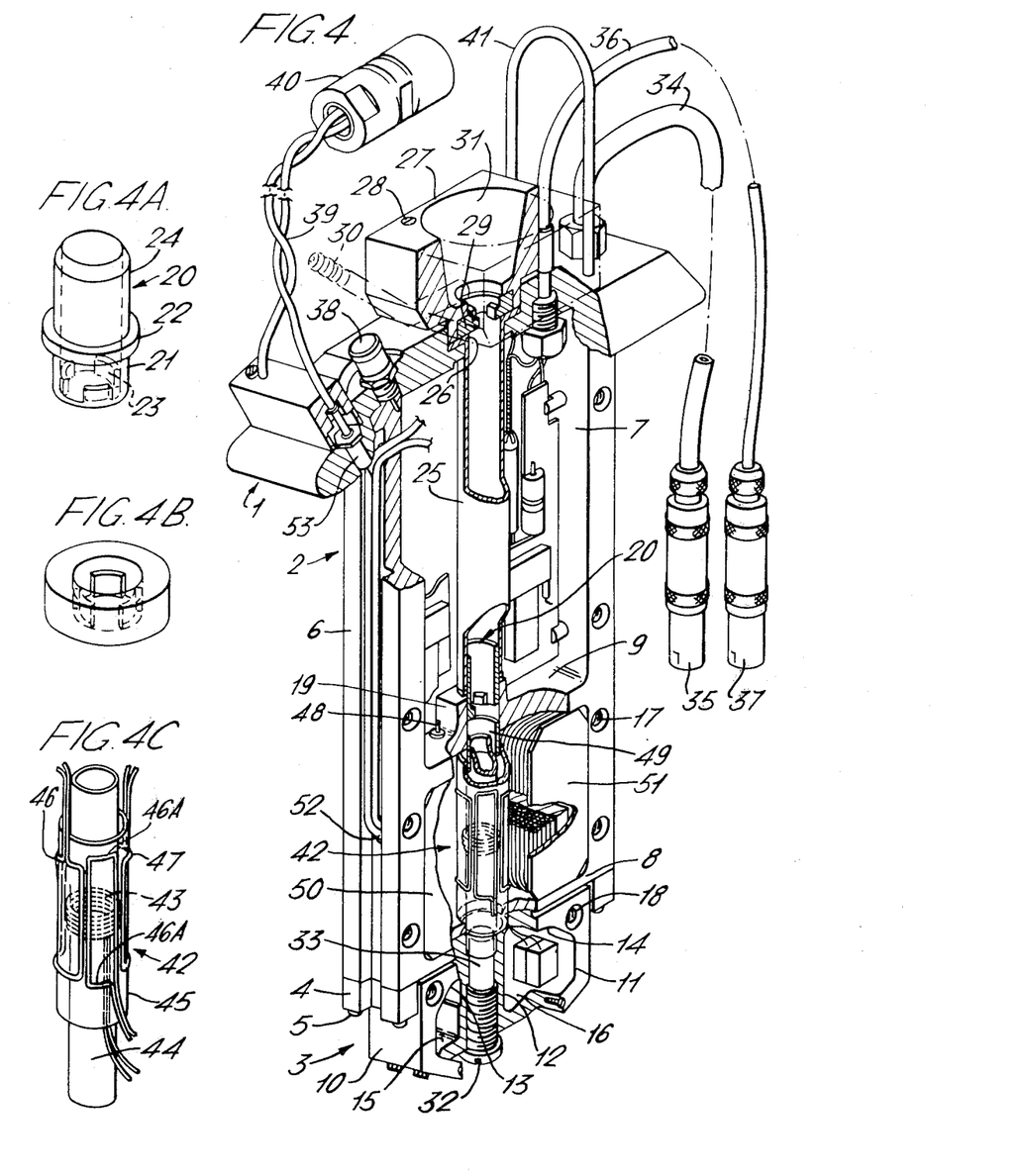
FIG. 4 is a perspective view of an NMR probe system in accordance with the present invention showing the mechanical construction thereof.
FIGS. 4A and 4B are enlarged details of FIG. 4.
FIG. 4C is a perspective enlarged view of a FIG. 4 cut-away showing the mounting of a pair of balancing coil halves with respect to a pair of transmitter coil halves and a single receiver coil.

We shall see presently, with reference to FIG. 4, that the four half coils are laid on the outer surface of a cylindrical former, with the magnetic axis of the two pairs of halves normal to the longitudinal axis of the former. In FIG. 3A, we have assumed a highly exaggerated perspective in looking along the length of a transparent former from one end thereof. Transmitter coil halves 1A and 1B are spaced on the common magnetic axis M1 and balancing coil halves 1C1 and 1C2 are spaced on the common magnetic axis M2, the two magnetic axis intersecting at right angles at LA, which symbolizes the longitudinal axis of the former seen end on.

Now, coil halves 1A and 1B are fed in parallel and since their magnetic field must coact we can "freeze" a situation when currents flow in them in the same direction, as seen by looking through both halves along their magnetic axis M1. Current direction is indicated by arrow heads on the active portions of the coil halves.

Voltages will be induced in the active portions of the balancing coil halves which are opposite in direction to that of the current flowing in the adjacent transmitter coil half portions. Again, arrow heads denote the sign and it is clearly seen that in each of the balancing coil halves, the voltages are of opposite sign. If we now assume that transmitter coil half 1B is inducing a higher RF voltage in the two balancing coil halves compared with transmitter coil half 1A, the voltages in the right-hand active portions of the balancing coil halves will predominate. This is indicated by the double arrow heads. The connection between coil half 1C1 and 1C2 must be such as to make the dominant induced voltages series-aiding.

Let us trace the required connection starting from the right-hand terminal of 1C2. The dominant voltage in the right-hand active portion will clearly overcome the lesser voltage in the left-hand portion and if the left-hand terminal is connected to the left-hand terminal of 1C1, it will also overcome the lesser voltage in the left-hand active portion of 1C1 and add to the dominant voltage in the right-hand active portion. It is immediately apparent that this connection would normally be series-opposing; in fact, it is series-opposing to any voltages induced by any stray coupling between the field modulation coils and the balancing coil halves. A similar reasoning may be applied if it is desired to connect the balancing half coils in current aiding configuration, which will require the left-hand terminal of one coil half to be connected to the right-hand terminal of the other coil.

In FIG. 3, one end of the series connected coil halves 1C1 and 1C2 is terminated to ground and the other end is extended to the junction between capacitors 34 and 33 via capacitor 1C3. The actual construction and disposition of the transmitter coil, balancing coil and receiver coil will be described later with reference to FIG. 4C.

In setting up the probe of FIG. 3, the potentiometer 13 and its counterpart in the lower network within frame F1 are set to the middle of their range and then with a 60 Mc/s supply extended to socket P, trimmer 21 and its counterpart in the network opposite are adjusted in turn until the voltage measured across 1A is approximately equal to that measured across its unreferenced counterpart under resonance conditions and the two halves terminate the RF feeder with its characteristic impedance. By substitution with a resistor having this impedance, it is possible to establish whether the proper impedance matching has been achieved through manipulation of trimmer 21 and its counterpart. After this preliminary adjustment has been made, the RF voltage across the balancing coil becomes negligible. On the other hand, a suitable meter connected to the receiver coil 10 will in general show the presence of a standing voltage due to stray electromagnetic and electrostatic couplings which cannot be eliminated by simply setting up a voltage balance between the two halves of the transmitter coil.

The next step is to adjust the position of the slider 13C (Frame 1 of FIG. 3) relative to that of its counterpart in the lower network, each slider being operated through a knob, until the slight electromagnetic induction imbalance between half 1A and its counterpart produces a voltage resultant in the balancing coil which is of the correct phase and amplitude to provide substantial cancellation of the standing RF voltage in receiver coil 10 as monitored by the meter referred to.

Within frame 3, there is shown the receiver coil 10 corresponding to the coil bearing the same reference in FIG. 2. Receiver coil 10 is shunted by capacitors 31, 32, 33 and 34 for terminating the RF line 35 with its characteristic impedance, capacitor 34 being variable to enable the matching to be refined. Capacitor 1C3 has already been mentioned. Its value is chosen so that the balancing coil applies a minimum loading on the receiver coil 10.

Here is a list of the component values chosen for the circuitry of FIG. 3 designed for an irradiating RF frequency of 60 Mc/s and a DC supply voltage of 12V:

| Within Frame F1 | | | Within Frame F2 | |
|---|---|---|---|---|
| Potentiometer | 13 | (5K) | Resistor 26 | (6.8K) |
| Resistors | 14 & 15 | (470) | Resistor 28 | (3.3K) |
| Resistors | 16 & 18 | (3.9K) | Capacitor 20 | (6.8p) |
| Capacitors | 17 & 19 | (100µF) | Capacitor 21 | (0–3.3p) |
| | | | Capacitor 24 | (220p) |
| | | | Capacitor 25 | (1000p) |
| Within Frame F3 | | | Capacitor 27 | (1000p) |
| | | | Capacitor 29 | (47p) |
| Capacitor | 31 | (12p) | Capacitor 30 | (270p) |
| Capacitor | 32 | (180p) | | |
| Capacitor | 33 | (47p) | | |
| Capacitor | 34 | (0–10p) | | |
| Capacitor | 35 | (22p) | | |

The components within frame F2 are actually mounted within the probe housing in a compartment that will be presently identified in the course of describing FIG. 4, which illustrates the mechanical layout of the production probe under review. The components within frame F1 are intended to be sited at a remote station, with the slider 13C and its counterpart below operable by means of separated knobs conveniently located on the front of a panel at said station to enable the user to turn one knob with the left hand and the other with the right while watching a centre-zero balance meter (not shown), which is also conveniently mounted on said panel.

FIG. 4 shows a main structure including a probe head 1, a depending probe body 2 and probe-body extension 3, each machined from an aluminum block.

Probe body 2 is provided with lugs (not shown) for fastening it by means of screws in a recessed part of the underside of probe head 1, and probe-body extension 3 is likewise provided with lugs 4 co-operating with screws 5 fastening the extension 3 to the bottom of probe body 2.

Probe body 2 has been milled out to define lateral walls 6 and 7, bottom wall 8 and partition wall 9, and similarly extension 3 has been machined to define lateral walls 10 and 11, partition wall 12, upper walls 13 and 14 and lower walls 15 and 16. There are thus defined two vertically spaced picture-framing openings in the probe body 2 and two horizontally spaced openings in probe-body extension 3.

The upper frame in probe body 2 accommodates electronic components associated with the probe balancing function, i.e., components within frame F2 in FIG. 3 (with the exception of coil half 1A and its unreferenced counterpart), the lower frame is reserved to electromagnetic coils presently to be described, and the frames in extension 3 house components associated exclusively with the receiver coil, i.e., the capacitors shown within frame F3 in FIG. 3.

After the components have been mounted within the frames of probe body 2, front and back cover plates (not shown) are secured over the frames by means of screws engaging in tapped holes 17. Covers are similarly fastened over the frames in extension 3, the walls of which are provided with tapped holes 18. Three separate electrostatically screened compartments are thus defined in a rigid structure which can be accurately reproduced by normal production methods.

The probe head 1, and the walls, 9, 8 and 12 are each provided with a round bore the axis of which is substantially coincident with the longitudinal axis of the probe. The lined up bores are intended to enable a cylindrical sample holder to be positioned for rotation around the probe axis.

The bore in the partition wall 9 is actually provided in an upstanding boss 19 and a nylon bushing 20 is pressed into it until the lower end thereof 21 (see FIG. 4A enlargement) has gone in far enough for the shoulder 22 to abut against the top face of the boss 19. The bushing 20 has three internal projections 23 acting as a bearing for a spinning sample holder in the form of a long glass tube (not shown in FIG. 4).

The upper part 24 of bushing 20 is intended to receive the bottom end of a screening aluminum tube 25 after the latter has been passed in the bore in probe head 1. The tube 25 has an upper flange 26 located in a recessed part around the centre bore in probe head 1, into which part fits the underside of a nylon block 27 fixed to probe head 1 by screws 28. The nylon block 27 serves three separate purposes: it bears on the flange 26 pressing tube 25 down against shoulder 22 of bushing 20; it holds a replaceable ring 29, provided with inward projections acting as a top bearing for a sample holder and shown enlarged in FIG. 4B; and forms part of an air turbine for spinning the sample holder by providing support for an air connection 30 terminating in an air nozzle (not shown) inside cavity 31 wherein a turbine wheel fixed to the top of the sample holder is accommodated when the sample holder is in position in the probe.

The bore running through partition wall 12 is threaded to receive a nylon screw 32 having a plain cylindrical portion 33 with a flat top acting as a thrust bearing for the convex bottom of a sample holder.

The electrical connections from within the probe are brought out through the probe head 1, wherein we have, on the one side thereof, receiver coil leads 34 (see leads 35 in FIG. 3) terminating at coaxial plug 35 (see plug 36 in FIG. 3) and the probe balance leads 36 (corresponding to L1 and L4 in FIG. 3) with plug 37, and on the other side, we have the transmitter coil socket 38 and the leads 39 with terminal plug 40 for the field modulation coils presently to be introduced.

The probe of FIG. 4 is intended to co-operate with supporting means such as plate mounted on the NMR polarizing magnet, e.g., over an opening machined in the barrel of a barrel magnet, to enable the user to insert the probe in the working gap of the magnet and locate it therein with repeatable accuracy, the front of the probe facing one pole face and the back the other pole face. To provide the necessary register, locating dowels (not shown) are inserted on the underside of the probe head 1 which fit into corresponding bores in the supporting plate. When the dowels are made to engage, the probe head 1 is pressed right down until its underside abuts against the supporting plate. Manipulation of the probe by the user is facilitated by the provision of an inverted-U wire 41 in which a finger may be inserted when the user desires to pull the probe off its seating for the purpose of withdrawing it from the working gap.

We shall now describe the parts contained within the lower frame of probe body 2, commencing with the transmitter, balancing and receiver coil arrangement 42. Referring to the enlarged view of the assembly shown in FIG. 4C, a receiver coil 43 comprising a few turns of enamelled copper wire is closely wound upon a thinwalled glass former 44, the top end of the wire being taken down and close to the outside surface of the coil and run snugly against the bottom end of the wire, the two parallel wire portions being made sufficiently long to reach the extension 3 for connection to the receiver-coil components housed therein. The receiver coil 43, including the end portions, is made fast to the glass former 44 by means of a suitable adhesive.

A second glass former 45 is positioned coaxially over the former 44 and the internal diameter is chosen so that the inner surface just clears the portion of the wire coming down over the outside of the receiver coil 43. Two symmetrical generally rectangular transmitter coil halves 46 and 47 are pressed over the glass former 45 in such manner that the substantially equal top and bottom sides of each half assume an arcuate shape corresponding to the curvature of the former. The two halves may, of course, be performed to the correct shape. The two ends of each coil are soldered to insulated terminal pillers passing through the partition wall 9, one of these pillers being shown at 48 in FIG. 4.

Another set of coil halves 46A and 47A (47 not visible in FIG. 4C) forming the balancing coil, are similarly mounted on former 44, on the cylindrical surface unoccupied by coil halves 46 and 47, so that the magnetic axis of transmitter coil and balancing coil intersect. The two balancing coil halves are series-aiding connected in the specific sense stated earlier. Electromagnetic coupling takes place, in the main, through the proximity of the coil sides extending lengthwise of the former 44 and it is easy to appreciate by inspection that if the same RF current is flowing in the same direction through two longitudinal sides of the transmitter halves each adjoining one longitudinal side of a balancing coil half this coil half will have induced in it opposing voltages. Similarly, for the other balancing coil half. Whichever polarity predominates in one half is in series aiding relation with the polarity that predominates in the other half.

In mounting the arrangement 42 within the lower frame in probe body 2, glass former 45, the length of which is a little less than the height of the opening in said lower frame, is slipped in position, the bottom end thereof being located in the bore in wall 8. A nylon sleeving 49 (see FIG. 4) is next pushed down the bore in boss 19 from the top (the bushing 20 and the tube 25 are not yet in position at this state) and allowed to protrude a little into the bore of former 45. Sleeving 49 forms a slight forced fit with both bores and as a result, former 45 is held in position.

The bottom end of former 44 is now secured by means of beeswax in a cylindrical recess at the top of the bore in wall 12 of extension 3 not yet attached to probe body 2. Extension 3 is then offered up to probe body 2, former 44 is guided into former 45, and extension 3 is pressed home, when the top of former 44 will slide through nylon sleeving 49 and the bottom of former 45 will abut against the top of the extension 3 over an annular area around said cylindrical recess. After screws 5 have been secured, beeswax is melted in the region of sleeving 49 as a safeguard against rattling of the parts.

The measurements we have chosen for the construction of the arrangement 42 are as follows:

| Former 44 | | Former 45 | |
|---|---|---|---|
| Length | 30 mm | Length | 25 mm |
| Inner diameter | 5.5 m | Inner diameter | 7.3 mm |
| Outer diameter | 6.3 mm | Outer diameter | 8.2 mm |
| | | Transmitter Coil Halves 46 & 47 | Balancing Coil Halves 46A & 47A |
| Length of sides parallel to receiver coil axis | | 0.26" | 0.50" |
| Length of sides transversal to receiver coil axis | | 0.30" | 0.25" |
| Gauge of wire | | 36 swg | 40 swg |
| Number of turns | | 1 | 1 |
| Receiver Coil 43 | | | |
| Length of coil | | 0.06" | |
| Wire gauge | | 32 swg | |
| Number of turns | | 6 | |

The lower frame of probe body 2 accommodates, in addition to arrangement 42, air-cored field modulation coils 50 and 51, each comprising 260 turns of 36 swg enamelled copper wire. The leads for the modulation coils emerge at 52 from the wall 6 of probe body 2 and proceed along a channel in said wall to two insulated terminal pillars 53. A similar channel in wall 7 accommodates the portion of leads 34 between extension 3 and the underside of probe head 1.

Bearing in mind what was said earlier with reference to FIG. 3A, it may now be appreciated that for any voltage induced in the balancing coil halves 46A and 47A (FIG. 4C but only half 46A is visible) by the modulation coils 50 and 51 the said halves are series-opposing. This means that any voltage induced in one at the field modulation frequency is substantially cancelled by the corresponding voltage induced in the other.

In the description of FIG. 4, no reference has been made to parts such as the screwed bushes for leads 34 and 36 which constitute mechanical details of little significance; similarly, the components shown in the probe body frame associated with the probe balancing function and the components within extension 3 associated with the receiving function have not been identified since the electrical diagram of FIG. 3 is sufficiently explicative.

It will be observed how in embodying the broad concept of the present invention in the probe construction of FIG. 4 all the advantages of the probe described with reference to FIG. 4 of our U.S. Pat. Spec. No. 1,275,902 have been retained but without introducing deliberate polarizing field distortion to achieve probe balance, which has led to an improvement in the actual performance of the probe system as a whole in terms of the faithfulness of the resonances observed. This improvement is all the more remarkable having regard to the satisfactory results we were achieving with our earlier probe system referred to.

What is claimed is:

1. In an NMR probe system of the type comprising substantially electromagnetically orthogonal RF transmitter and receiver coils, a balancing coil adjacent and electromagnetically coupled to the transmitter coil as well as in RF signal transfer relationship with the receiver coil, and electrical trimmers of RF amplitude and phase associated with the transmitter coil, whereby adjustment of said trimmers enables in operation an RF voltage to be set up in the balancing coil that is of the correct phase and amplitude for substantially cancelling any spurious RF voltage in the receiver coil due to stray induction effects.

2. In an NMR probe system of the type comprising substantially electromagnetically orthogonal RF transmitter and receiver coils, the said transmitter coil being divided into two halves, a balancing coil intermediate between said halves that is in RF signal transfer relationship with the receiver coil and electromagnetically coupled to both of said halves so that RF voltages of opposite phase are induced therein from one and other of said halves, and electrical trimmers of RF amplitude and phase associated with each transmitter half, whereby adjustment of said trimmers enables in operation a dominant RF voltage to be set up in the balancing coil that is of the correct phase and amplitude substantially to cancel any spurious RF voltage in the receiver coil due to stray induction effects.

3. In an NMR probe system of the type comprising substantially electromagnetically orthogonal RF transmitter and receiver coils, the said transmitter coil being divided into two halves, a balancing coil similarly divided into two halves with the half of one coil intermediate between the two halves of the other coil and electromagnetically coupled thereto so that RF voltages of opposite phase are induced in each balancing coil half from one and other transmitter half, the two balancing coil halves being connected so that the dominant induced RF voltage in one half aids the dominant induced RF voltage in the other half and the connected halves being in RF signal transfer relationship with the receiver coil, and electrical trimmers of RF phase and amplitude associated with each transmitter coil half, whereby adjustment of said trimmers enables in operation dominant RF voltages to be set up in the balancing coil halves which together provide the correct phase and amplitude substantially to cancel any spurious RF voltage in the receiver coil due to stray induction effects.

4. The system of claim 3, wherein the two transmitter halves are spaced on a substantially common electromagnetic axis.

5. The system of claim 4, wherein the balancing coil halves are spaced on a substantially common electromagnetic axis that is substantially orthogonal to the electromagnetic axis of the transmitter halves.

6. The system of claim 5, wherein the electromagnetic coupling between the transmitter and balancing coil halves is mainly confined to adjacent rectilinear portions of the coil halves which in the operational attitude of the probe extend substantially at right angles to the axis of the NMR polarizing field.

7. The system of claim 6, wherein the coil halves are of generally rectangular shape and the said rectilinear portions represent the long sides of the coil halves.

8. The probe system of claim 7, wherein the coil halves comprise a single turn.

9. The system of claim 3, wherein the two halves of the transmitter coil are adapted for parallel feed from a source of RF potential.

10. The system of claim 9, wherein the amplitude trimmers are variable resistors and the phase trimmers are variable capacitors, a variable resistor and variable capacitor being placed in parallel with each transmitter coil half.

11. The system of claim 10, wherein the trimmers are devices that alter in value in response to electrical energization thus enabling remote control of amplitude and phase by purely electrical means.

12. The system of claim 11, wherein the amplitude trimmers are P.I.N. diodes and the phase trimmers are Varicaps.

* * * * *

UNITED STATES PATENT AND TRADEMARK OFFICE
CERTIFICATE OF CORRECTION

PATENT NO. : 4,052,661
DATED : October 4, 1977
INVENTOR(S) : Peter Higham and Robert Alan Hoult It is certified that error appears in the above-identified patent and that said Letters Patent are hereby corrected as shown below:

Title page, Assignee should be changed from "The Perkin-Elmer Corporation, Norwalk, Conn." to --Perkin-Elmer limited--.

Column 2, line 27, delete "homoengeity" and insert in place thereof --homogeneity--.

Column 2, line 45, delete "honogeneous" and insert in place thereof --homogeneous--.

Column 2, line 59, delete "megnetic" and insert in place thereof --magnetic--.

Column 4, line 57, delete "andd" and insert in place thereof --and--.

Column 5, line 32, delete "rapdidly" and insert in place thereof --rapidly--.

Column 5, line 42, after the word "coil" insert --half--.

Column 10, line 36, after the number "47" insert --A--.

In the table in column 11, below "Former 44" and after "Inner diameter 5.5 m" insert --m--.

Signed and Sealed this

Fourteenth Day of March 1978

[SEAL]

Attest:

RUTH C. MASON
Attesting Officer

LUTRELLE F. PARKER
Acting Commissioner of Patents and Trademarks